US005278361A

United States Patent [19]

Field

[11] Patent Number: 5,278,361

[45] Date of Patent: Jan. 11, 1994

[54] LOUDSPEAKER SYSTEM

[75] Inventor: Daniel J. Field, Greenwood, Ind.

[73] Assignee: Thomson Consumer Electronics, Inc., Indianapolis, Ind.

[21] Appl. No.: 14,182

[22] Filed: Feb. 5, 1993

[51] Int. Cl.[5] .............................................. H05K 5/00

[52] U.S. Cl. .................................. 181/145; 181/154; 181/156; 181/199

[58] Field of Search ............... 181/145, 147, 152, 153, 181/154, 155, 156, 199, 141; 381/24, 88, 89, 90, 154, 158, 159

[56] References Cited

U.S. PATENT DOCUMENTS

| | | | |
|---|---|---|---|
| 3,862,366 | 1/1975 | Huszty et al. | 381/89 X |
| 5,005,201 | 4/1991 | Rumreich et al. | 381/24 |
| 5,036,946 | 8/1991 | Yoshino | 181/156 |
| 5,092,424 | 3/1992 | Schreiber et al. | 181/145 |
| 5,147,986 | 9/1992 | Cockrum et al. | 181/145 |
| 5,181,247 | 1/1993 | Holl | 381/89 X |

*Primary Examiner*—Michael L. Gellner
*Assistant Examiner*—Khanh Dang
*Attorney, Agent, or Firm*—Joseph S. Tripoli; Peter M. Emanuel; Frederick A. Wein

[57] ABSTRACT

A multiple speaker loudspeaker system wherein an internal baffle extends the full length of the interior volume dividing the interior volume into two unequal portions. The baffle has folded portions, which is not parallel to the walls of the enclosure. Loudspeakers are mounted onto the folded portions within a first volume. The loudspeakers radiate sound into a second volume. One of the first and second volume is ported in a band-pass configuration, to the outside of the enclosure. Thus, the non-parallel portions of the baffle reduce unwanted peaks and/or cancellations in the sound emanating from the enclosure. Additionally, the baffle is secured along its width to top and bottom walls of the enclosure, thus also providing extra rigidity to the enclosure.

4 Claims, 2 Drawing Sheets

LOUDSPEAKER SYSTEM

BACKGROUND

The present invention relates to a sound system and more particularly to a sound system for use with a television receiver.

In loudspeaker systems, and particularly speaker systems for reproducing bass, there is a substantial problem with unwanted resonances and with the undesirable vibrations of cabinet structures in response to signals at various frequencies. These vibrations are particularly a problem for large enclosure walls which have no intermediate support between their secured edges. In order to prevent such vibrations, enclosure components have to be more sturdy and/or heavy enough to either resist such vibrations, or to bring the natural resonant frequencies of the various cabinet structures below that of the signal frequencies. If vibration can be reduced without resort to more sturdy or heavy parts, the parts can be cost reduced, and the cost of shipping due to a reduced weight can be realized.

It is desirable in a loudspeaker enclosure that parallel surfaces be reduced to a minimum since parallel surfaces can set up resonant/anti-resonant frequencies within the cabinet (acoustic standing waves) and cause unwanted peaks and/or cancellations in the idealized flat frequency response. Additionally, such resonant frequencies set up vibration modes as discussed above, which can cause extraneous sounds, such as buzz.

Recently, music systems have been designed that are known as bandpass low frequency enclosures. These enclosures acoustically filter out much of the harmonic distortion sound components produced by woofer loudspeakers at high sound levels. These arrangements use a subchamber which has a port tube coupling the subchamber to the outside of the enclosure. Such arrangements are shown in U.S. Pat. Nos. 4,549,631 of Bose, 5,033,577 of Veranth, and 5,092,424 of Schreiber et al.

SUMMARY OF THE INVENTION

Briefly, the present invention concerns a multiple speaker loudspeaker system wherein an internal baffle extends the full length of the interior volume dividing the interior volume into two unequal volumes. The baffle has folded portions, which is not parallel to the walls of the enclosure. Loudspeakers are mounted onto the folded portions within a first volume. The loudspeakers radiate sound into a second volume. One of the first and second volume is ported in a bandpass configuration, to the outside of the enclosure. Thus, the non-parallel portions of the baffle reduce unwanted peaks and/or cancellations in the sound emanating from the enclosure. Additionally, the baffle is secured along its width to top and bottom walls of the enclosure, thus also providing extra rigidity to the enclosure.

DETAILED DESCRIPTION OF THE PREFERRED EMBODIMENT

Figure 1:
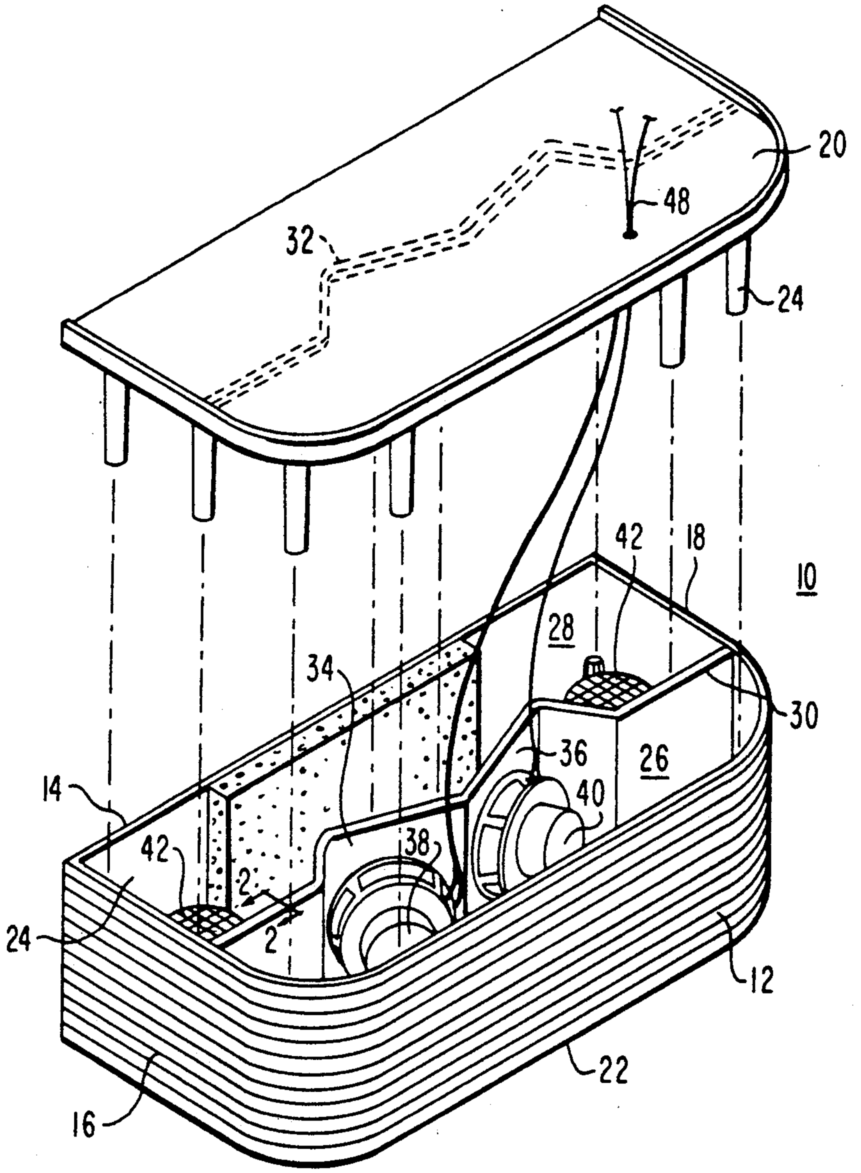
FIG. 1 is an exploded isometric view of the loudspeaker system according to aspects of the present invention.
Figure 2:
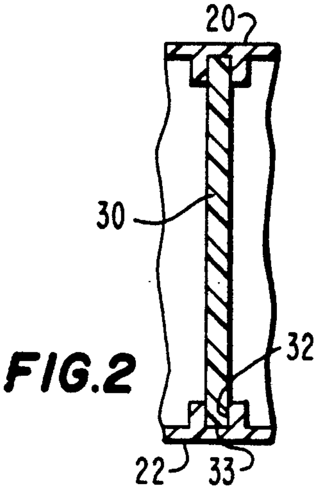
FIG. 2 is a cross-sectional view approximately along line 2—2 of FIG. 1.
Figure 3:
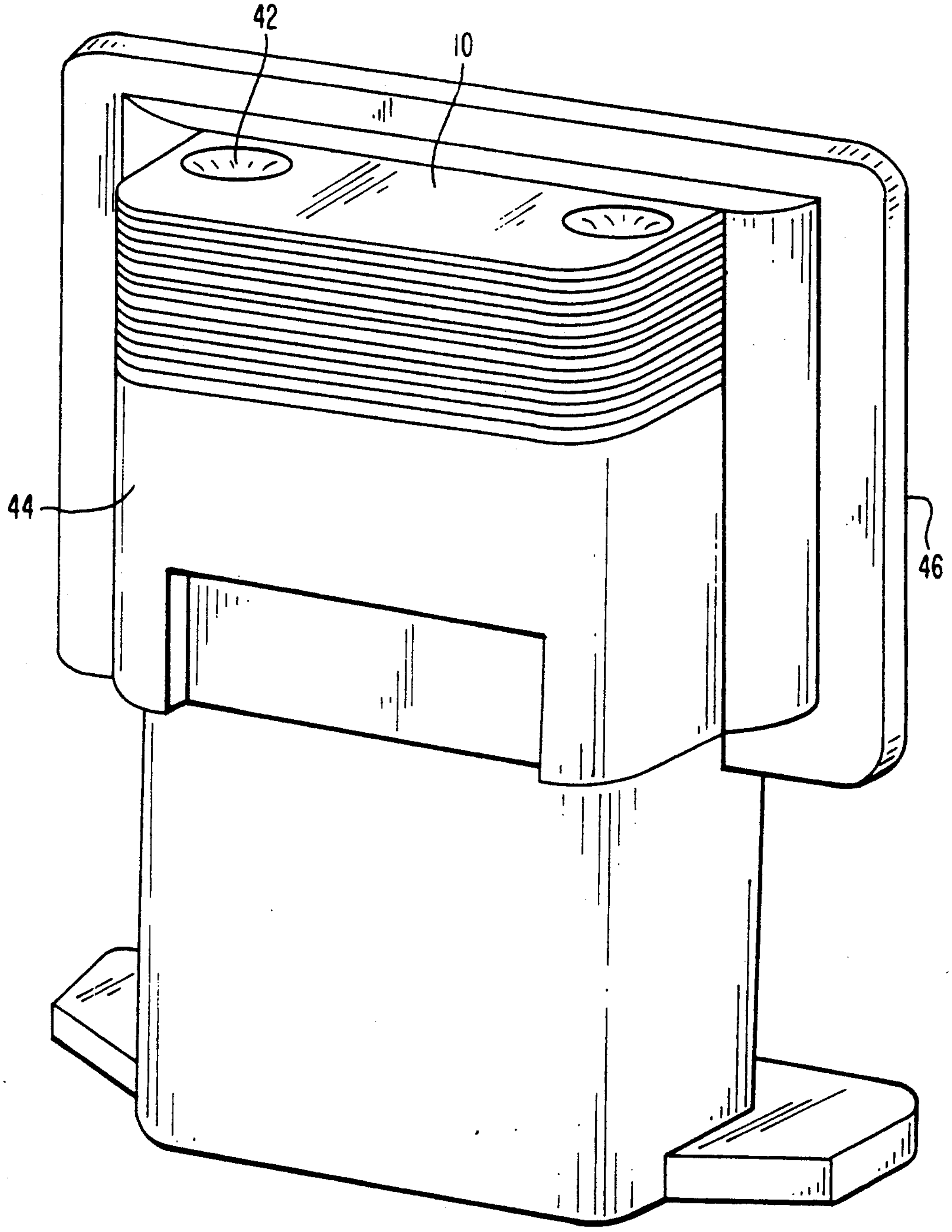
FIG. 3 shows the loudspeaker system of the present invention mounted onto a television receiver.

Referring now to the various Figures, the loudspeaker enclosure, generally designated 10, includes front and back walls 12, 14, side walls 16, 18, and top and bottom walls 20, 22, all of which define a volume 24. Volume 24 is divided into a first volume 26 and a second volume 28 by baffle 30. Baffle 30 is rigidly secured at its longitudinal ends to sidewalls 16, 18 and is further rigidly secured across its width within groove 33 of ridges 32 in top and bottom 22, 20 when the enclosure 10 is fully assembled. Top 22 is secured also to bottom 20 by screw attachment posts 24.

Baffle 30 is formed with a folded portions 34, 36 which partially face each other at angles of other than the 180 degrees for a planar baffle. Ridges 32 provide a close fit along the longitudinal length of baffle 30 so that baffle 30 provides additional rigidity to members 20, 22. A pair of loudspeakers 38, 40 are mounted onto respective folded portions 34, 36 within volume 26, with their sound output radiating into volume 28 and into a sound diffuser 37 mounted on front wall 12. In the exemplary embodiment, loudspeakers 38, 40 have a free air resonance of about 70 Hz, and a cabinet loaded resonance of about 80 Hz. In the exemplary embodiment, the sound generated by loudspeakers 38, 40 within volume 28 is coupled to the outside of the enclosure by a pair of vented ports 42. The relative dimensions of volumes 24, 26, and the positioning and size of vented ports 42 provide a bandpass low frequency filter for the produced sound. Enclosure 10 is designed to be mounted on top of a cabinet 44 of a television receiver 46 having a visual display device (not shown) with the vent ports 42 facing upwardly.

Loudspeakers 38, 40 are driven through leads 48 by signals from different channels. Additionally, since the two loudspeakers for different channels share the same undivided volume 26, the bass sounds from each of the channels emanating from vent ports 42 arrive at the listener at the same time, and do not exhibit any cancellation or interference commonly experienced in multiple loudspeaker systems.

Baffle 30, in addition to providing increased rigidity for enclosure 10, serves the dual purpose of its folded portions 34, 36 providing an acoustic structure which is not parallel to the sides of the cabinet. In this manner, unwanted peaks and/or cancellations are reduced for both of volumes 26 and 28. The non-parallelism provided by such an internal structure permits the maintaining a generally rectangular enclosure which is more aesthetically pleasing to the eye than a triangular prism or pyramid shape for the cabinet.

I claim:

1. A loudspeaker system:

- a loudspeaker enclosure having a plurality of outer walls,
- a baffle secured at opposite ends of its length to a first pair of diametrically opposed outer walls, the baffle dividing the enclosure into a first and second volume, the enclosure having at least one vented port between the second volume and the outside of the enclosure,
- a pair of loudspeakers mounted on the baffle within the first volume with the sound produced being conducted outwardly from the enclosure through the at least one vented ports, the baffle having at least a first and second portions folded towards each other at an angle of other than 180 degrees, each of the pair of loudspeakers being mounted on a respective first and second portion.

2. The system of claim 1 wherein the baffle is additionally secured along its width between a second pair of diametrically opposed outer walls for providing additional strength and rigidity to the enclosure.

3. The system of claim 1 wherein the system is integral with a television receiver including a visual display device, and provides sound program material for visual images shown on the display device.

4. The system of claim 1 including means for driving each of the pair of loudspeakers with different signals.

* * * * *